US010553917B2

(12) United States Patent
Ota et al.

(10) Patent No.: US 10,553,917 B2
(45) Date of Patent: Feb. 4, 2020

(54) CONDUCTOR MODULE

(71) Applicant: Yazaki Corporation, Tokyo (JP)

(72) Inventors: Takao Ota, Tokyo (JP); Kazuya Harakawa, Tokyo (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/048,554

(22) Filed: Jul. 30, 2018

(65) Prior Publication Data

US 2019/0044197 A1   Feb. 7, 2019

(30) Foreign Application Priority Data

Aug. 4, 2017 (JP) .................. 2017-151366

(51) Int. Cl.
| H01M 10/48 | (2006.01) |
|---|---|
| H01R 12/59 | (2011.01) |
| H05K 1/02 | (2006.01) |
| H01M 10/42 | (2006.01) |
| H01M 2/20 | (2006.01) |

(Continued)

(52) U.S. Cl.
CPC ......... *H01M 10/482* (2013.01); *H01M 2/206* (2013.01); *H01M 10/425* (2013.01); *H01R 12/592* (2013.01); *H05K 1/028* (2013.01); *H05K 1/0281* (2013.01); *H01M 2010/4271* (2013.01); *H01M 2010/4278* (2013.01); *H01R 4/30* (2013.01); *H01R 11/288* (2013.01); *H01R 12/69* (2013.01); *H05K 1/0263* (2013.01); *H05K 1/189* (2013.01); *H05K 2201/052* (2013.01);

(Continued)

(58) Field of Classification Search
CPC .. H01M 10/482; H01M 2/206; H01M 10/425; H01M 2010/4271; H01M 2010/428; H01R 12/592; H01R 11/288; H01R 12/68; H05K 1/028; H05K 1/0281; H05K 1/0263; H05K 1/189; H05K 2201/052; H05K 2201/10037; H05K 2201/10181; H05K 2201/10272
See application file for complete search history.

(56) References Cited

U.S. PATENT DOCUMENTS

2019/0123334 A1   4/2019  Kataoka et al.

FOREIGN PATENT DOCUMENTS

| JP | 2008-147045 | * | 6/2008 | .............. H01M 6/46 |
|---|---|---|---|---|
| JP | 5223607 B2 | | 6/2013 | |
| JP | 2017-84766 A | | 5/2017 | |

* cited by examiner

*Primary Examiner* — Helen Oi K Conley
(74) *Attorney, Agent, or Firm* — Sughrue Mion, PLLC (57) ABSTRACT

A conductor module includes a wiring member, a plurality of bus bars, and a plurality of locking pieces. The wiring member is formed in a film shape with flexibility, and a plurality of wirings and through-holes are formed therein. The bus bar is electrically connected to one of two electrode terminals. The two through-holes are formed in a first opposing region opposing one end face between both end faces of the bus bar opposing each other in a width direction of the bus bar with an electrical connection portion where the bus bar and the wiring are electrically connected interposed therebetween when viewed from the width direction. The locking piece is formed integrally with the bus bar, is arranged in the through-hole, has a distal end positioned radially outward of the through-hole when viewed from an axial direction of the through-hole, and fixes the bus bar to the wiring member.

12 Claims, 9 Drawing Sheets

(51) Int. Cl.
*H01R 12/69* (2011.01)
*H01R 4/30* (2006.01)
*H05K 1/18* (2006.01)
*H01R 11/28* (2006.01)

(52) U.S. Cl.
CPC .............. *H05K 2201/10037* (2013.01); *H05K 2201/10181* (2013.01); *H05K 2201/10272* (2013.01)

CONDUCTOR MODULE

CROSS-REFERENCE TO RELATED APPLICATION(S)

The present application claims priority to and incorporates by reference the entire contents of Japanese Patent Application No. 2017-151366 filed in Japan on Aug. 4, 2017.

BACKGROUND OF THE INVENTION

1. Field of the Invention

The present invention relates to a conductor module.

2. Description of the Related Art

There is a conductor module used for a battery module having a plurality of battery cells. For example, the conductor module includes a plurality of bus bars as connection conductors electrically connected to one of two electrode terminals of the battery cell and electrically connected to an electrode terminal of the adjacent battery cells, and a voltage detector which is a film-like wiring member on which a plurality of detection conductors are formed or a plurality of electric wires each having a detection conductor to detect a voltage of the battery cell (see Japanese Patent No. 5223607).

In the conductor module, a group of the bus bars and the detection conductors are subjected to soldering, resistance welding, ultrasonic bonding, laser welding, and the like to electrically connect the bus bars and the detection conductors, thereby forming an electrical connection portion.

Meanwhile, the conductor module has an accommodating member accommodating the plurality of bus bars and the voltage detector. The conductor module is attached to the battery module in a state where the plurality of bus bars and the voltage detector are accommodated in the accommodating member. Thus, the battery module has a height including the accommodating member, and thus, there is a demand for reduction in the height of the conductor module in order to downsize the battery module.

Regarding the reduction in the height of the conductor module, it is considered to fix the plurality of bus bars and the voltage detector without using the accommodating member. In this case, the film-like wiring member is used as the voltage detector in order to reduce the height of the conductor module, and the respective bus bars and the detection conductors of the wiring member are electrically connected to each other, and thus, each of the bus bars is fixed to the wiring member at the electrical connection portion. However, since the connection between each of the bus bars and each of the detection conductors is intended for electrical connection, there is a risk that connection reliability of the electrical connection portion may deteriorate because stress is generated in the electrical connection portion when each of the bus bars attempts to move relative to the wiring member.

SUMMARY OF THE INVENTION

The present invention has been made in view of the above-described problem, and an object thereof is to provide a conductor module capable of obtaining reduction in height and suppressing deterioration of connection reliability by reliably fixing a connection conductor to a film-like wiring member.

In order to achieve the above mentioned object, a conductor module according to one aspect of the present invention includes at least two or more connection conductors that are electrically connected to one of two electrode terminals of a battery cell in a battery module having a plurality of the battery cells; a film-like wiring member having flexibility in which at least two or more detection conductors, which electrically connect the single connection conductor and a state detection device detecting a state of the battery cell electrically connected to the connection conductor, are formed; and a fixing member that fixes the connection conductor to the wiring member, wherein the wiring member has a connection conductor accommodating portion accommodating the connection conductor and a through-hole penetrating from a front surface to a back surface, at least two of the through-holes are formed in a first opposing region of the wiring member, which opposes one end face between two end faces of the connection conductor opposing each other in an opposing direction of the connection conductors with an electrical connection portion where the connection conductor and the detection conductor are electrically connected interposed between the at least two of the through-holes when viewed from the opposing direction, and the fixing member is fixed to the connection conductor in a state where relative movement with respect to the connection conductor is restricted, is arranged in the through-hole, and has a distal end positioned radially outward of the through-hole when viewed from an axial direction of the through-hole.

According to another aspect of the present invention, in the conductor module, it is preferable that the fixing member is formed integrally with the connection conductor and is a locking piece which is inserted into the through-hole to be arranged in the through-hole.

According to still another aspect of the present invention, in the conductor module, it is preferable that the wiring member is formed with the connection conductor interposed therebetween in the opposing direction, and one or more of the through-holes is further formed in a second opposing region of the wiring member which opposes the other end face between two end faces of the connection conductor opposing each other in the opposing direction.

According to still another aspect of the present invention, in the conductor module, it is preferable that two of the through-holes are formed in the first opposing region with the electrical connection portion interposed therebetween when viewed from the opposing direction, and two of the through-holes are formed in the second opposing region with the electrical connecting portion interposed therebetween when viewed from the opposing direction.

According to still another aspect of the present invention, in the conductor module, it is preferable that a bent portion, which protrudes toward one of the front surface side and the back surface side, is formed in the wiring member between the adjacent connection conductors when viewed from the opposing direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Incidentally, the invention is not limited by the embodiment. In addition, constituent elements in the following embodiment include one that can be replaced by a person skilled in the art or substantially the same one.

Embodiment

Figure 1:
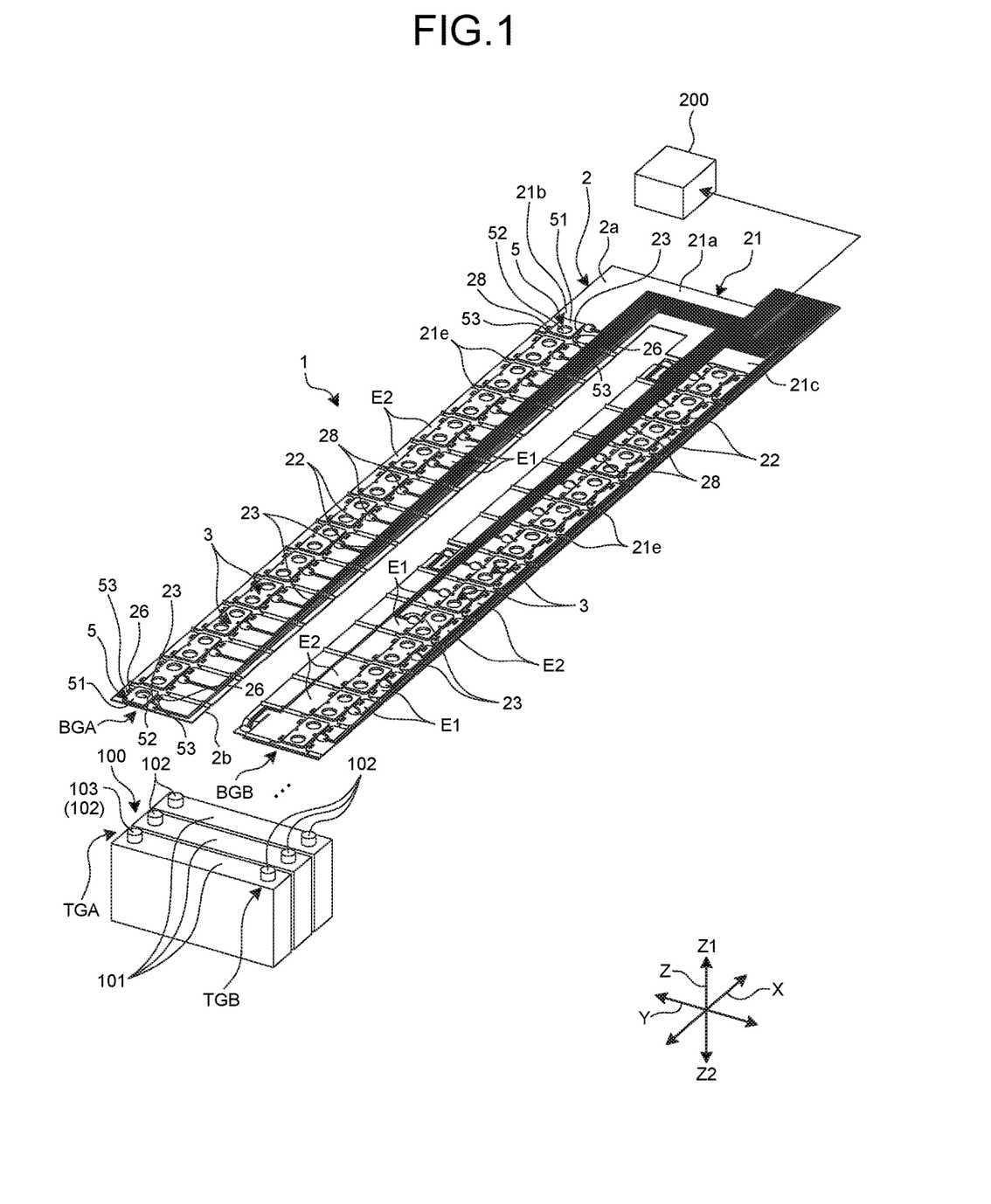
FIG. 1 is a perspective view of a conductor module according to an embodiment.
Figure 2:
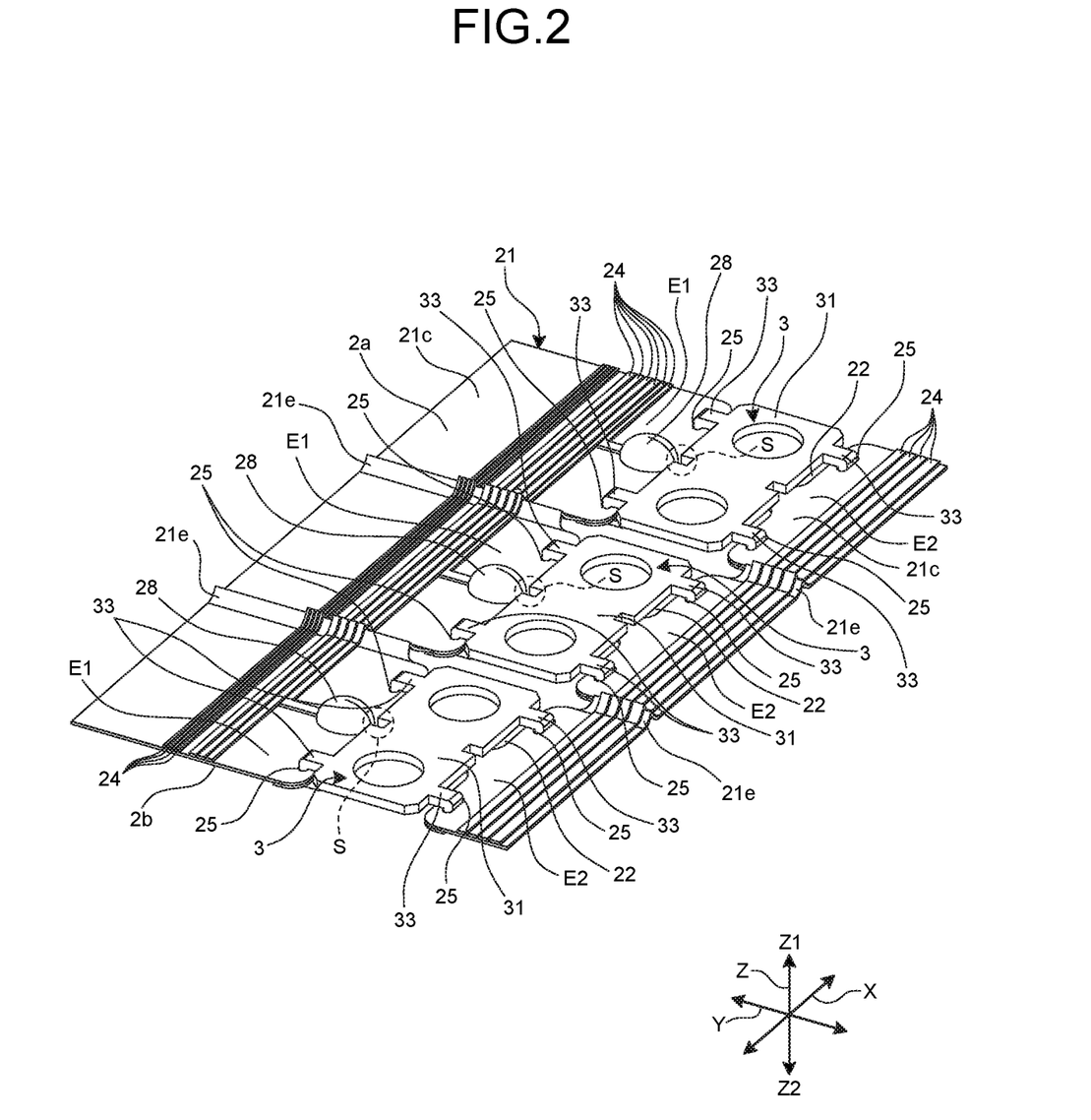
FIG. 2 is a perspective view of the main part of the conductor module according to the embodiment.
Figure 3:
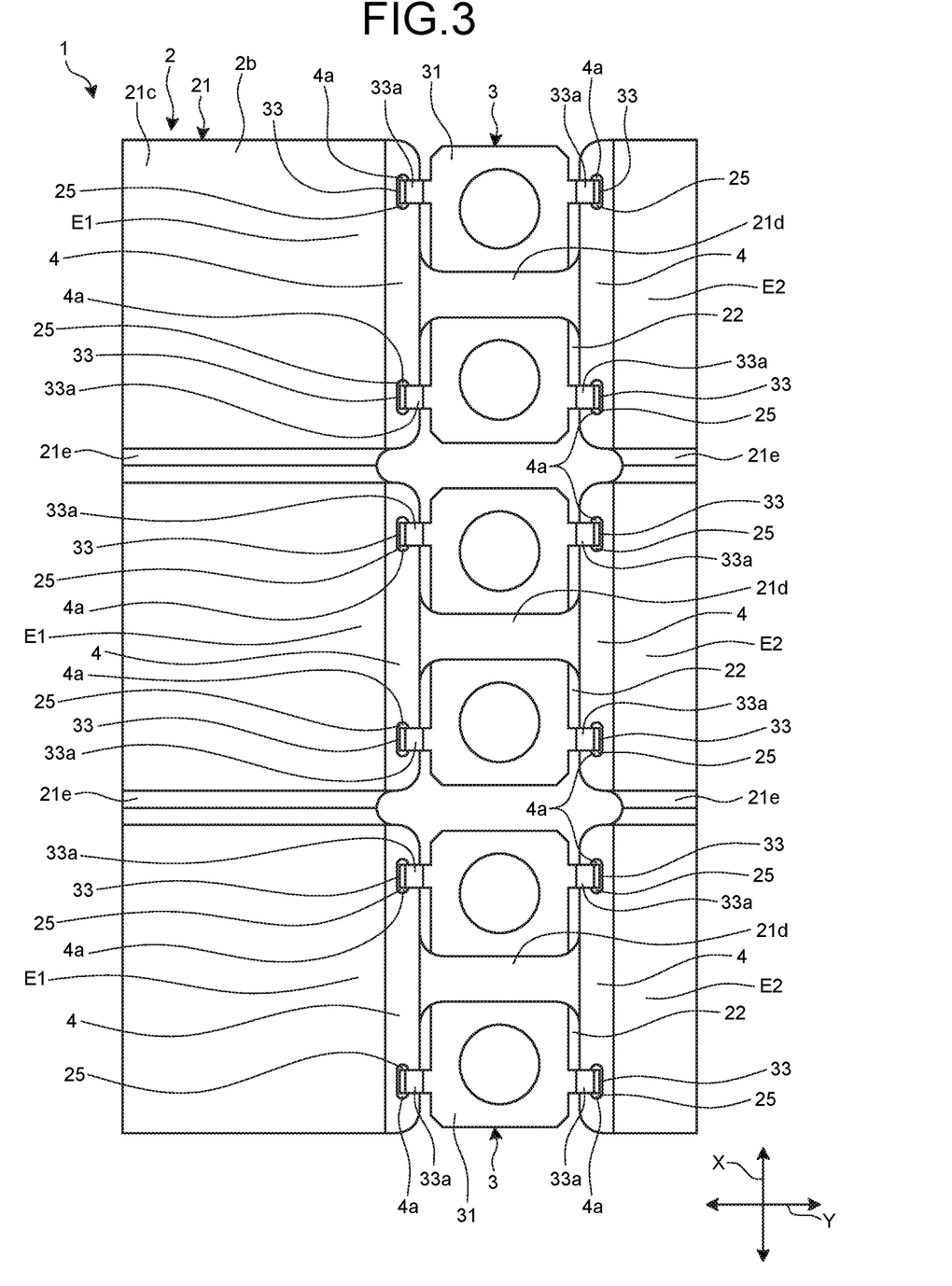
FIG. 3 is a bottom view of the main part of the conductor module according to the embodiment.
Figure 4:
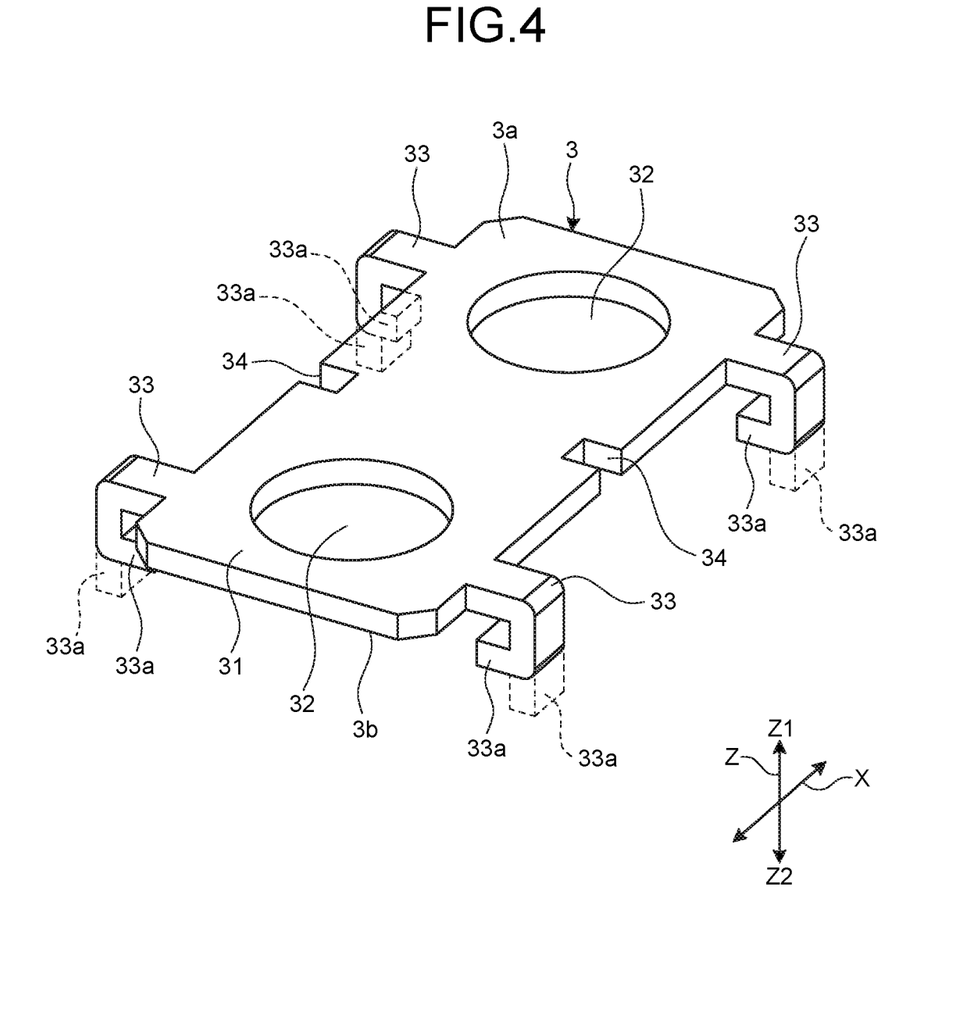
FIG. 4 is a perspective view of a bus bar according to the embodiment.
Figure 5:
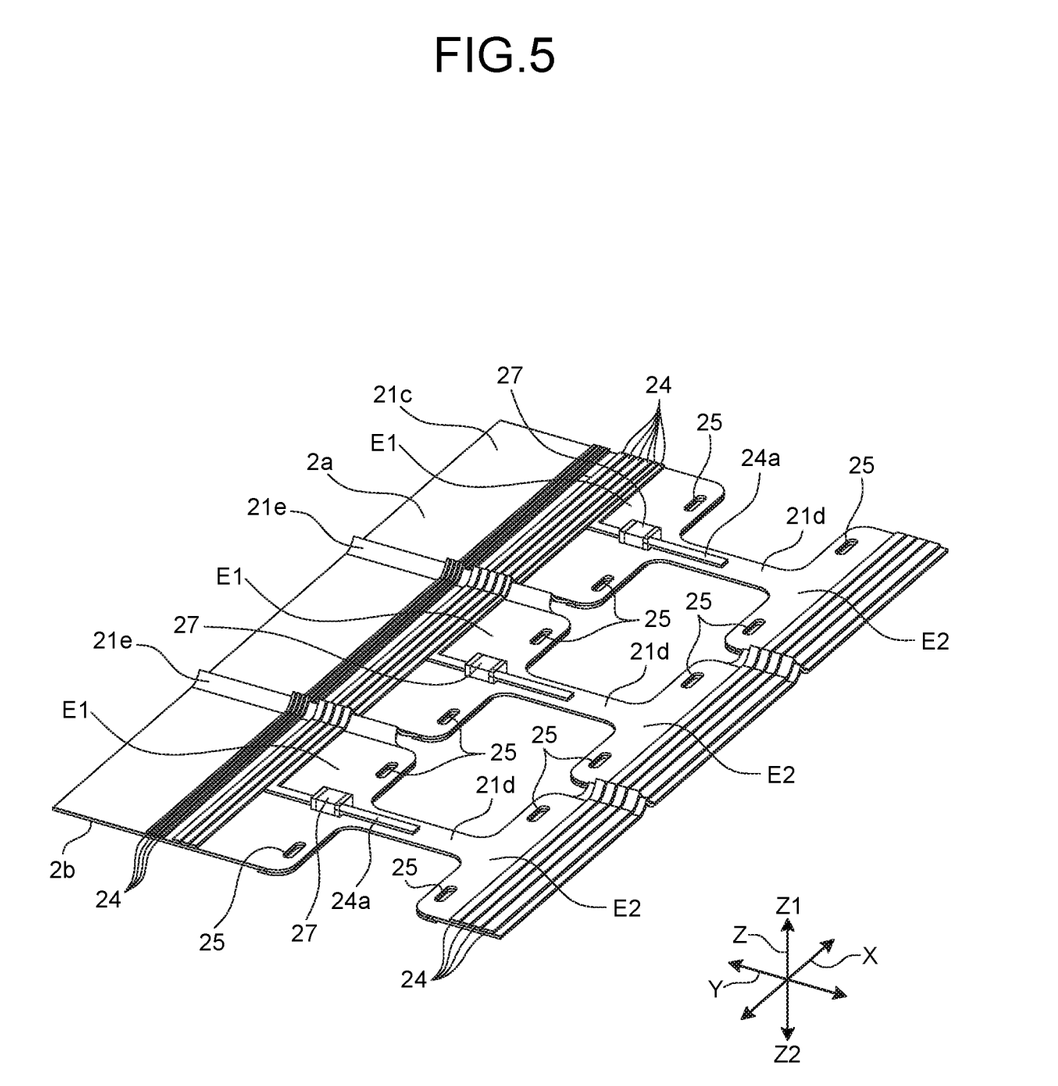
FIG. 5 is a perspective view of the main part of the conductor module according to the embodiment.

First, a conductor module according to an embodiment will be described. FIG. 1 is a perspective view of the conductor module according to the embodiment. FIG. 2 is a perspective view of a main part of the conductor module according to the embodiment. FIG. 3 is a bottom view of the main part of the conductor module according to the embodiment. FIG. 4 is a perspective view of a bus bar according to the embodiment. FIG. 5 is a perspective view of the main part of the conductor module according to the embodiment. Incidentally, FIG. 2 is an enlarged perspective view obtained by enlarging the main part of FIG. 1, and is a perspective view of a wiring member when viewed from the front surface. FIG. 3 is an enlarged view obtained by enlarging the main part of the wiring member when viewed from a back surface. FIG. 5 is a view in which the bus bar and a fuse protection member are omitted from FIG. 2. Here, an X direction in each drawing (including FIGS. 6 to 9) is an array direction of an electrode terminal and the bus bar according to the present embodiment. A Y direction is a width direction of the bus bar and the wiring member according the present embodiment, is an opposing direction of the bus bars, and is a direction orthogonal to the array direction. A Z direction is a vertical direction of the bus bar and the wiring member and is a direction orthogonal to the array direction and the width direction. A Z1 direction is an upward direction and a Z2 direction is a downward direction.

As illustrated in FIG. 1, a conductor module 1 according to the present embodiment is assembled to a battery module 100. The battery module 100 is configured by, for example, modularizing a plurality of battery cells 101 such as secondary batteries that are arrayed in the array direction. The battery module 100 is mounted on, for example, an electric vehicle (EV) or a hybrid vehicle (HV, PHV), and is used to supply electric power to a rotary electric machine serving as a drive source and to store (charge) electric power generated by the rotary electric machine. For example, the battery module 100 can obtain a high battery output corresponding to an output required by a vehicle by connecting the plurality of battery cells 101 in series. The plurality of battery cells 101 have a pair of electrode terminals 102 (a positive electrode terminal and a negative electrode terminal) at both ends in the width direction, and are arranged such that the electrode terminals 102 adjacent to each other in the array direction of the battery cells 101 adjacent in the array direction have different polarities. In the battery module 100, two electrode terminal groups TGA and TGB constituted by the plurality of electrode terminals 102 arranged in the array direction are formed in two rows to be spaced apart from each other in the width direction. The battery module 100 is assembled with the conductor module 1 corresponding to the electrode terminal group TGA and TGB, and the electrode terminals 102 (the positive electrode terminal and the negative electrode terminal) of the plurality of battery cells 101 are connected in series by the conductor module 1. Both ends of the plurality of electrode terminals 102 in the battery module 100 in the state of being connected in series by the conductor module 1 function as terminating terminals 103 electrically connected to the outside of the battery module 100.

The conductor module 1 is configured to connect the plurality of battery cells 101 in series, and includes a wiring member 2, a plurality of bus bars 3, a plurality of locking pieces 33 which are fixing members, a reinforcing member 4, and a pair of terminating bus bars 5 as illustrated in FIGS. 1 to 5. The conductor module 1 detects a state of the battery cell 101 connected to each of the bus bars 3 via each wiring 24 of the wiring member 2, that is, voltage information in the present embodiment, and outputs the voltage information to a battery module monitoring unit 200. The battery module monitoring unit 200 is a state detection device that detects the state of each of the battery cells 101, and for example, monitors the state of each of the battery cells 101 based on the voltage information, detects an abnormality in the battery cell 101, and notifies a driver of the abnormality. In addition, the battery module monitoring unit 200 can also output the acquired voltage information to a battery ECU that controls the battery module 100, and charging and discharging control of the battery module 100 or the like is performed by the battery ECU based on the voltage information.

As illustrated in FIGS. 1 to 5, the wiring member 2 electrically connects the electrode terminal 102 and the battery module monitoring unit 200 via the respective bus bars 3. In addition, each of the bus bars 3 is mechanically fixed to the wiring member 2. The wiring member 2 is formed in a film shape with flexibility, and is a flexible printed circuit board (FPC) on which the plurality of wirings 24 are printed, that is, mounted in the present embodiment. The wiring member 2 has a front surface 2a on an upper side and a back surface 2b on a lower side, which are formed to oppose each other in the vertical direction, and has a substrate main body 21, a plurality of bus bar accommodating portions 22, a pair of terminating bus bar accommodating portions 23, the plurality of wirings 24, a through-hole 25, a terminating through-hole 26, a fuse 27, and a protection member 28.

The substrate main body 21 has flexibility and insulating properties, and is a film formed using synthetic resin or the like. The substrate main body 21 has a connecting portion 21a, two bus bar group holding portions 21b and 21c, a connecting portion 21d, and a bent portion 21e. The connecting portion 21a connects the two bus bar group holding portions 21b and 21c. The connecting portion 21a has a rectangular shape with the width direction as the longitudinal direction thereof, and has ends in one side in the array direction to which the two bus bar group holding portions 21b and 21c are connected with an interval in the width direction. A connector (not illustrated) is fixed to an end of the connecting portion 21a on the other side in the array direction, and the connecting portion 21a electrically connects the plurality of wirings 24 and the battery module monitoring unit 200 via at least the connector. The two bus bar group holding portions 21b and 21c have rectangular shapes with the array direction as the longitudinal direction thereof. The bus bar group holding portion 21b according to the present embodiment corresponds to a bus bar group BGA including a plurality of bus bars 3 and the pair of terminating bus bars 5, and the plurality of bus bar accommodating portions 22 and 23 are formed along the array direction midway in the width direction. The bus bar group holding portion 21b has the terminating bus bar accommodating portions 23 corresponding to the terminating bus bars 5 of the bus bar group BGA at both ends in the array direction, and the plurality of bus bar accommodating portions 22 corresponding to the respective bus bars 3 of the bus bar group BGA are formed between the pair of terminating bus bar accommodating portions 23. The bus bar group holding portion 21c according to the present embodiment corresponds to a bus bar group BGB including a plurality of bus bars 3, and the plurality of bus bar accommodating portions 22 corresponding to the respective bus bars 3 of the bus bar group BGA are formed midway in the width direction. The connecting portion 21d is formed in the bus bar accommodating portion 22 and connects both ends of the bus bar accommodating portion 22 in the width direction in the substrate main body 21, that is, in the opposing direction. The connecting portion 21d according to the present embodiment is formed at a center portion in the array direction of the bus bar accommodating portion 22. The bent portion 21e is formed between the bus bar accommodating portions 22 and the terminating bus bar accommodating portions 23 adjacent to each other in the array direction when viewed from the width direction, that is, the opposing direction. In addition, the bent portion 21e is formed between the reinforcing members 4 adjacent to each other in the array direction when viewed from the width direction. The bent portion 21e is formed to protrude toward the front surface 2a side in the vertical direction when viewed from the width direction. The bent portion 21e according to the present embodiment is formed in a V shape or a U shape with an opening on the back surface 2b side when viewed from the width direction.

The bus bar accommodating portion 22 and the terminating bus bar accommodating portion 23 are connection conductor accommodating portions, accommodate the bus bar 3 and the terminating bus bar 5, respectively, and are space portions that penetrate through the substrate main body 21 in the vertical direction and communicate with the outside on the front surface 2a and the back surface 2b of the wiring member 2. Each of the bus bar accommodating portions 22 accommodates the single bus bar 3, and the plurality of bus bar accommodating portions 22 are formed in the array direction in each of the two bus bar group holding portions 21b and 21c. The pair of terminating bus bar accommodating portions 23 accommodate the pair of terminating bus bars 5, respectively, and are formed at both ends of the bus bar group holding portion 21b, respectively, in the array direction of the plurality of bus bar accommodating portions 22 formed in the array direction. The bus bar accommodating portion 22 and the terminating bus bar accommodating portion 23 according to the present embodiment communicate with each other in the array direction and are formed as one space portion in each of the two bus bar group holding portions 21b and 21c.

The plurality of wirings 24 are detection conductors and electrically connect the bus bars 3 and 5 with the battery module monitoring unit 200. The wiring 24 according to the present embodiment is formed on a plane on the upper side of the substrate main body 21, and is covered with a cover film (insulating layer) that is not illustrated. The wiring 24 is formed by forming a conductor layer on the plane on the upper side of the substrate main body 21 and then performing an etching process, and may be formed by discharging an ink having conductivity from a nozzle onto the substrate main body 21 and curing the ink on the surface of the substrate main body 21. The single wiring 24 corresponds to each of the bus bars 3 and the terminating bus bar 5, and has one end electrically connected to a terminal (not illustrated) of a connector and the other end, that is, a distal end 24a formed in the connecting portion 21d. The distal end 24a forms the electrical connection portion S, and a part thereof is cut out so that electrical conduction is blocked. Incidentally, both the ends of the wiring 24 are formed to be exposed from the cover film. Here, the wirings 24 corresponding to the bus bar group BGA among the plurality of wirings 24 are formed on one side of the bus bar accommodating portion 22 and the terminating bus bar accommodating portion 23 in the width direction in the bus bar group holding portion 21b. Among the plurality of wirings 24, the wirings 24 corresponding to the bus bar group BGB are formed on both sides in the bus bar group holding portion 21c with the bus bar accommodating portion 22 interposed therebetween in the width direction.

The through-hole 25 and the terminating through-hole 26 penetrate from the front surface 2a to the back surface 2b of the wiring member 2, and are configured to allow the locking pieces 33 and 53 to be described later of the bus bar 3 and the terminating bus bar 5 to be inserted therein so that the locking pieces 33 and 53 are arranged in the through-hole 25 and the terminating through-hole 26. In the wiring member 2, the through-hole 25 is formed at least in a first opposing region E1 which opposes one end face between both end faces of the bus bar 3 opposing each other in the opposing direction. The through-hole 25 according to the present embodiment is formed in each of the first opposing region E1 and a second opposing region E2, which oppose each other with each of the bus bar accommodating portions 22 interposed therebetween in the width direction, of the substrate main body 21. Therefore, the opposing regions E1 and E2 are arrayed with an interval in the array direction. Two through-holes 25 are formed in the first opposing region E1 with the electrical connection portion S where the bus bar 3 and the wiring 24 are electrically connected interposed therebetween. In addition, two through-holes 25 are formed in the second opposing region E2 at positions opposing the two through-holes 25 formed in the first opposing region E1, respectively, in the width direction with the bus bar 3 interposed therebetween. That is, the two through-holes 25 are formed in each of the first opposing region E1 and the second opposing region E2 with respect to the single bus bar 3, and the electrical connection portion S is positioned between the through-holes 25 adjacent in the array direction when viewed from the width direction. In the present embodiment, the single terminating through-hole 26 is formed in each of regions of the substrate main body 21 opposing each other with the terminating bus bar accommodating portion 23 interposed therebetween in the width direction.

The fuse 27 electrically protects the battery module monitoring unit 200 and blocks the electrical connection via the wiring 24 between the bus bar 3 and the terminating bus bar 5, and the battery module monitoring unit 200 when an overcurrent flows to the wiring 24. The fuse 27 is formed to correspond to each of the wirings 24, and is arranged in a cut-out formed at the distal end 24a so as to make the wiring 24 conductive whose conduction is cut midway.

The protection member 28 protects the fuse 27, has insulating properties, and is formed using synthetic resin or the like. The protection member 28 is formed to correspond to each of the fuses 27 and is formed to cover the surface of the substrate main body 21 such that the fuse 27 is not exposed to the outside.

The bus bar 3 is a connection conductor and is electrically connected to one of the two electrode terminals 102 of the battery cell 101 as illustrated in FIGS. 1 to 4. The bus bar 3 according to the present embodiment is directly connected to the electrode terminals 102 of two different poles adjacent in the array direction of the two adjacent battery cells 101 among the electrode terminal groups TGA or TGB arranged in a row. The bus bar 3 is formed in a flat plate shape, for example, using a material having conductivity such as metal. The bus bar 3 has a main body portion 31, a terminal hole 32, the plurality of locking pieces 33, and a pair of cut-outs 34.

The main body portion 31 is formed in a rectangular plate shape with the array direction as the longitudinal direction thereof when viewed from the vertical direction. The plurality of bus bars 3 are arrayed in a row in the array direction to correspond to each of the electrode terminal groups TGA and TGB such that the longitudinal direction of the main body portions 31 becomes parallel to the array direction.

The electrode terminal 102 is inserted into the terminal hole 32. The terminal hole 32 penetrates a front surface 3a and a back surface 3b that oppose each other in the vertical direction. In the present embodiment, the two terminal holes 32 are formed in the bus bar 3 so as to correspond to the two electrode terminals 102 to be connected, and are formed to be spaced apart from each other in the array direction. Incidentally, the bus bar 3 is fixed to the electrode terminal 102 as a nut (not illustrated) is screwed onto a screw groove formed at an end protruding from the front surface 3a side of the terminal hole 32 in a state where the electrode terminal 102 is inserted in the terminal hole 32, for example.

The locking piece 33 is a fixing member, and is formed integrally with the bus bar 3 which is the connection conductor in the present embodiment. That is, the locking piece 33 is fixed to the bus bar 3 in a state where relative movement with respect to the bus bar 3 is restricted. The locking piece 33 fixes the bus bar 3 to the wiring member 2. The locking piece 33 corresponds to each of the through-holes 25 formed in the first opposing region E1 and the second opposing region E2. The locking piece 33 is inserted into the through-hole 25 and is arranged in the through-hole 25. The two locking pieces 33 according to the present embodiment are formed on two end faces, which oppose each other in the opposing direction of the bus bar 3, that is, the width direction of the bus bar 3, respectively, to be spaced apart from each other in the longitudinal direction. The locking piece 33 has a flat plate shape, has one end connected to the main body portion 31, and is formed to protrude to the side opposite to the main body portion 31 side in the width direction. The locking piece 33 is bent downward and is further bent toward the main body portion 31 in the width direction so that a distal end 33a, which is the other end, is formed toward the main body portion 31 in the width direction. In other words, the locking piece 33 is formed in a U shape having an opening on the main body portion 31 side in the width direction when viewed from the longitudinal direction, and the distal end 33a is positioned radially outward of the through-hole 25 in a fixing state of the bus bar 3 when viewed from an axial direction of the through-hole 25. Incidentally, the locking piece 33 is not bent toward the main body portion 31 in the width direction, and the distal end 33a is formed to be directed downward in a pre-fixing state before the bus bar 3 is fixed to the wiring member 2 (broken lines in FIG. 4).

The cut-out 34 forms the electrical connection portion S, and is formed on the first opposing region E1 side in the width direction of the main body portion 31 in the fixing state where the bus bar 3 is fixed to the wiring member 2. When viewed from the vertical direction in the fixing state, the cut-out 34 opposes a portion of the distal end 24a of the wiring 24 positioned at the connecting portion 21d. The cut-out 34 according to the present embodiment is formed by cutting out inward each of the both end faces in the width direction of the main body portion 31. The pair of cut-outs 34 are formed to penetrate from the front surface 3a to the back surface 3b at the center portion in the array direction of the main body portion 31. The electrical connection portion S for electrically connecting the bus bar 3 and the distal end 24a of the wiring 24 by soldering, resistance welding, ultrasonic bonding, laser welding, or the like is formed at the cut-out 34.

The reinforcing member 4 reinforces the wiring member 2. The reinforcing member 4 has flexibility and insulating properties, and is formed using synthetic resin or the like similarly to the substrate main body 21. When viewed from the axial direction of the through-hole 25, that is, the vertical direction, the reinforcing member 4 is formed to surround at least each of the plurality of through-holes 25. The reinforcing member 4 according to the present embodiment is formed on the back surface 2b of the wiring member 2. The reinforcing member 4 is formed to surround the two through-holes 25 formed in the first opposing region E1. In addition, the reinforcing member 4 is formed to surround the two through-holes 25 formed in the second opposing region E2. That is, the reinforcing member 4 is formed to surround all the through-holes 25 formed in each of the first opposing region E1 and the second opposing region E2. The reinforcing member 4 is formed in a strip shape along the longitudinal direction of the first opposing region E1 and the second opposing region E2 of the substrate main body 21, and a communicating hole 4a is formed at a position opposing each of the through-holes 25 in the vertical direction, and the communicating hole 4a is formed to communicate with the through-hole 25. That is, the locking piece 33 is inserted into the communicating hole 4a, and the locking piece 33 is arranged therein. Here, since the opposing regions E1 and E2 are arrayed with the interval in the array direction, a plurality of the reinforcing members 4 oppose each other with the bus bar 3 interposed therebetween in the width direction and are arrayed at intervals in the array direction. Here, the reinforcing member 4 is formed to have a thickness equal to or larger than a width in the vertical direction, that is, a thickness of the substrate main body 21. Incidentally, a reinforcing member (not illustrated), which is formed to surround each of the terminating through-holes 26, is formed on the back surface 2b of the wiring member 2 for the pair of terminating through-holes 26, which is similar to the reinforcing member 4.

The terminating bus bar 5 is the connection conductor and is electrically connected to the terminating terminal 103 as illustrated in FIG. 1. The terminating bus bar 5 according to the present embodiment is directly connected to the terminating terminal 103. The terminating bus bar 5 is formed in a flat plate shape using a material having conductivity such as metal. The terminating bus bar 5 has a main body portion 51, a terminal hole 52, and the plurality of locking pieces 53. The main body portion 51 is formed in a rectangular shape when viewed from the vertical direction. The pair of terminating bus bars 5 are positioned at both ends in the array direction of the plurality of bus bars 3 corresponding to the electrode terminal group TGA. The terminating terminal 103 is inserted into the terminal hole 52. Incidentally, the terminating bus bar 5 is fixed to the terminating terminal 103 as a nut (not illustrated) is screwed onto a screw groove formed at an end protruding from the front surface side of the terminal hole 52 in a state where the terminating terminal 103 is inserted in the terminal hole 52, for example. The locking piece 53 fixes the terminating bus bar 5 to the wiring member 2. The locking piece 53 corresponds to each of the terminating through-holes 26. The locking piece 53 has a flat plate shape, has one end connected to the main body portion 51, and is formed to protrude to the side opposite to the main body portion 51 side in the width direction. The locking piece 53 is bent downward and is further bent toward the main body portion 51 in the width direction so that a distal end, which is the other end, is formed toward the main body portion 51 in the width direction. In other words, the locking piece 53 is formed in a U shape having an opening on the main body portion 51 side in the width direction when viewed from the longitudinal direction, and the distal end is positioned radially outward of the terminating through-hole 26 in a fixing state of the terminating bus bar 5 when viewed from an axial direction of the terminating through-hole 26. Incidentally, the locking piece 53 is not bent toward the main body portion 51 in the width direction, and the distal end is formed to be directed downward in a pre-fixing state before the terminating bus bar 5 is fixed to the wiring member 2.

Next, assembling of the conductor module 1 according to the present embodiment will be described. First, a worker prepares the substrate main body 21 in the state before the bus bar accommodating portion 22, the terminating bus bar accommodating portion 23, the through-hole 25, and the terminating through-hole 26 are formed therein, and mounts the plurality of wirings 24, the plurality of fuses 27, and the plurality of protection members 28 onto the substrate main body 21. Next, the worker forms the reinforcing member 4 in the substrate main body 21. Here, each of the reinforcing members 4 that reinforces the wiring member 2 is prepared in advance as a single strip-shaped member with the array direction as the longitudinal direction thereof, and is fixed to the lower surface of the substrate main body 21 via a fixing member such as an adhesive so as to cover positions where the bus bar accommodating portion 22, the terminating bus bar accommodating portion 23, the through-hole 25, and the terminating through-hole 26 are to be formed when viewed from the vertical direction. Next, the worker forms the bus bar accommodating portion 22, the terminating bus bar accommodating portion 23, the through-hole 25, and the terminating through-hole 26 in the substrate main body 21, and also forms the reinforcing members 4 and the communicating hole 4a. The worker fixes the substrate main body 21 to which the strip-shaped member, which is to serve as each of the reinforcing members 4, is attached to a jig (not illustrated), and causes a cutting member (not illustrated) to vertically pass through the substrate main body 21 to form the bus bar accommodating portion 22, the terminating bus bar accommodating portion 23, the through-hole 25, and the terminating through-hole 26. At this time, the strip-shaped member is divided into each of the reinforcing members 4 and reinforcing members corresponding to the terminating bus bar accommodating portion 23 when forming the bus bar accommodating portion 22 and the terminating bus bar accommodating portion 23 in the substrate main body 21. In addition, the cutting member is caused to vertically pass through the strip-shaped member to form communicating holes 4a corresponding to the respective through-holes 25 and communicating holes corresponding to the pair of terminating through-holes 26 when forming the through-hole 25 and the terminating through-hole 26 in the substrate main body 21.

Next, the worker fixes the bus bar 3 and the terminating bus bar 5 to the wiring member 2. The bus bar 3 and the terminating bus bar 5 in the pre-fixing state are formed such that the distal end 33a and the distal end are directed downward. Therefore, the worker inserts each of the locking pieces 33 of each of the bus bars 3 into each of the through-holes 25 corresponding to the single bus bar accommodating portion 22, and causes the distal end 33a to protrude from the lower surface side of the substrate main body 21, that is, the back surface 2b of the wiring member 2. In addition, the worker inserts each of the locking pieces 53 of each of the terminating bus bars 5 into each of the terminating through-holes 26 corresponding to the single terminating bus bar accommodating portion 23, and causes the distal end to protrude from the back surface of the substrate main body 21, that is, the back surface 2b of the wiring member 2. Next, the worker bends the locking pieces 33 and 53 toward the main body portion 31 and the main body portion 51, respectively, in the width direction by using the jig. That is, the locking pieces 33 and 53 are caulked with respect to the wiring member 2 and the reinforcing member 4. As a result, the distal end 33a of the locking piece 33 and the distal end of the locking piece 53 are positioned radially outward of the through-hole 25 and the terminating through-hole 26, respectively, and the fixation of the bus bar 3 and the terminating bus bar 5 to the wiring member 2 is completed. Next, the worker electrically connects each of the bus bars 3 and each of the terminating bus bars 5 to the wiring 24, thereby forming the electrical connection portion S.

As described above, the locking piece 33 is arranged in the through-hole 25, and the distal end 33a is positioned radially outward of the through-hole 25 when viewed from the vertical direction in the conductor module 1 according to the present embodiment, and thus, the bus bar 3 is mechanically fixed to the wiring member 2. Therefore, the wiring member 2 and the bus bar 3 are fixed at a position different from the electrical connection portion S where the bus bar 3 and the wiring 24 are connected. That is, a mechanical connection portion between the wiring member 2 and the bus bar 3 and the electrical connection portion S are different from each other in the conductor module 1. The through-holes 25 forming the mechanical connection portions are formed on the same side as the electrical connection portion S in the width direction, and is formed with the electrical connection portion S interposed therebetween when viewed from the width direction. That is, the mechanical connection portions fix the bus bar 3 to the wiring member 2 in a state where the electrical connection portion S is arranged therebetween. Accordingly, it is possible to suppress generation of stress on the electrical connection portion S even when the relative movement between the wiring member 2 and the bus bar 3, for example, the relative movement in the array direction, or twist around the width direction or around the array direction occurs. As a result, the conductor module 1 reliably fixes the bus bar 3 to the film-like wiring member 2 so that an accommodating member is unnecessary, and thus, it is possible to obtain the reduction in height and to suppress deterioration of connection reliability.

In addition, in the conductor module 1 according to the present embodiment, the locking piece 33, which is the fixing member, is formed integrally with the bus bar 3, and it is possible to reduce the number of parts as compared with the case where the fixing member is provided as a separate member. Therefore, it is possible to simplify the assembling process and to obtain reduction of material cost. As a result, the conductor module 1 can be easily manufactured and obtain cost reduction.

In addition, the locking piece 33 is arranged in the through-hole 25, and the mechanical connection portion is formed not only in the first opposing region E1 but also in the second opposing region E2 in the conductor module 1 according to the present embodiment. Therefore, the bus bars 3 fixed to the wiring member 2 in the bus bar accommodating portion 22 are not only fixed at a plurality of locations spaced apart from each other in the array direction, but also fixed at a plurality of locations spaced apart from each other in the width direction. As a result, the conductor module 1 according to the present embodiment has the polygonal mechanical connection portion for fixing the wiring member 2 and the bus bar 3, and thus, can reliably fix the bus bar 3 to the wiring member 2. In addition, it is possible to maintain the state where the bus bar 3 is accommodated in the bus bar accommodating portion 22 without supporting the bus bar 3, and thus, the conductor module 1 can be easily handled and more easily manufactured.

In addition, the locking pieces 33 are arranged in the four through-holes 25, and the mechanical connection portion forms the quadrangle in the conductor module 1 according to the present embodiment, and thus, it is possible to more reliably fix the bus bar 3 to the wiring member 2. In addition, since the locking pieces 33 can be formed line-symmetrically in the array direction in the bus bar 3, the locking pieces 33 can be inserted into each of the through-holes 25 without considering an orientation around the vertical direction of the bus bar 3 with respect to the bus bar accommodating portion 22. Therefore, the conductor module 1 can be more easily manufactured.

In addition, the conductor module 1 according to the present embodiment, when the wiring members 2 receive an external force in the array direction with the bent portion 21e interposed therebetween, the bent portion 21e is deformed toward the back surface 2b, and elastically deformed here, so that it is possible to widen the interval in the array direction between the wiring members 2 with the bent portion 21e interposed therebetween. In addition, when a state where the external force is received is changed to a state where the external force is not received, the bent portion 21e is elastically restored, so that it is possible to narrow the interval from the state where the interval in the array direction of the wiring members 2 with the bent portion 21e interposed therebetween is widened. Therefore, it is possible to change the interval in the array direction between the adjacent bus bars 3 fixed to the wiring member 2, that is, the interval in the array direction of the terminal holes 32 between the adjacent bus bars 3. Therefore, the battery cell 101 to which the bus bar 3 is fixed expands and contracts in the array direction due to influence of heat so that the bent portion 21e is deformed even if a distance in the array direction between the electrode terminals 102 of the adjacent battery cells 101 changes, and the wiring member 2 can follow up such deformation. As a result, it is possible to suppress the generation of stress on the wiring member 2, and to improve durability of the wiring member 2.

Figure 6:
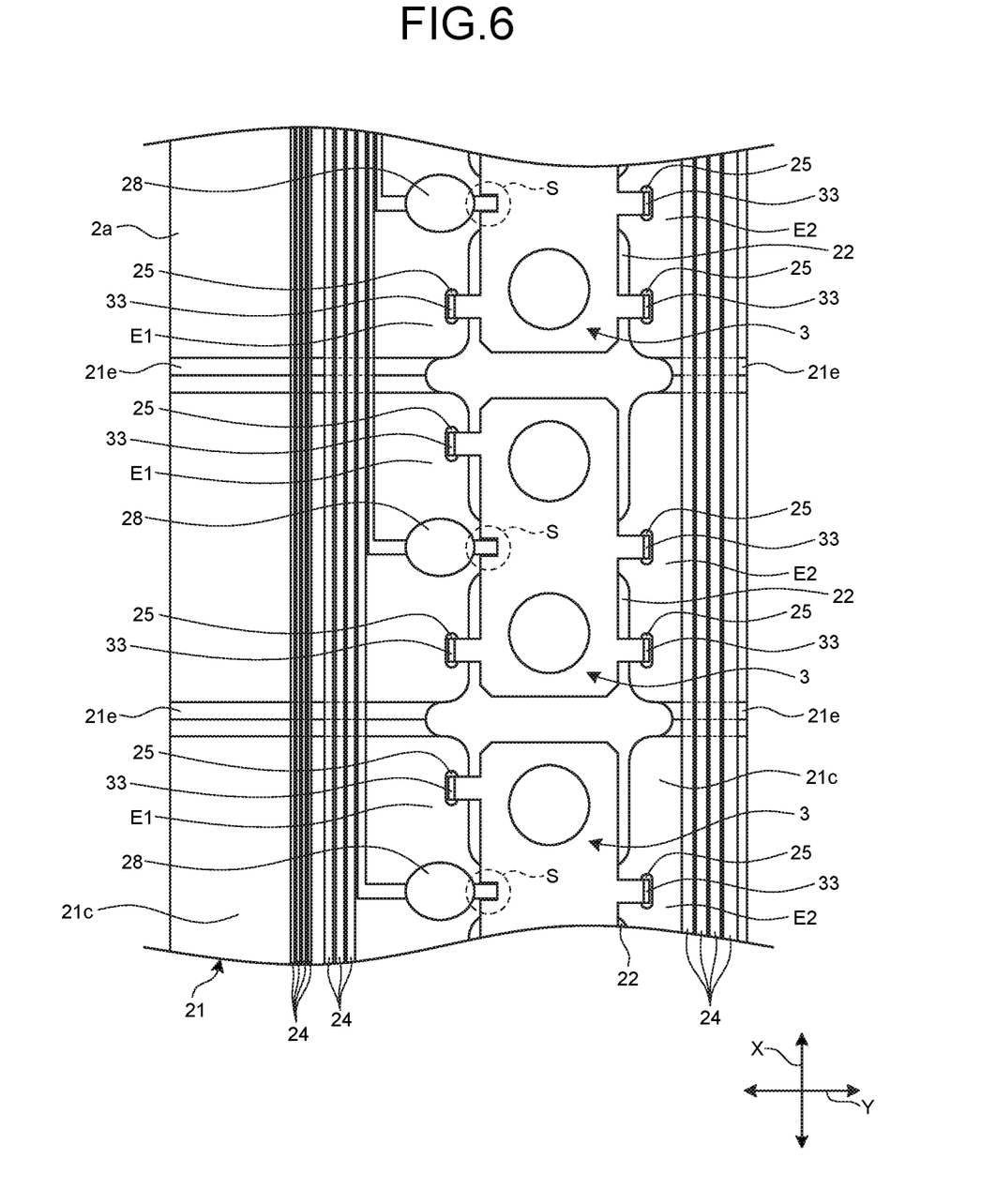
FIG. 6 is a plan view of the main part illustrating a modification of the conductor module according to the embodiment.
Figure 7:
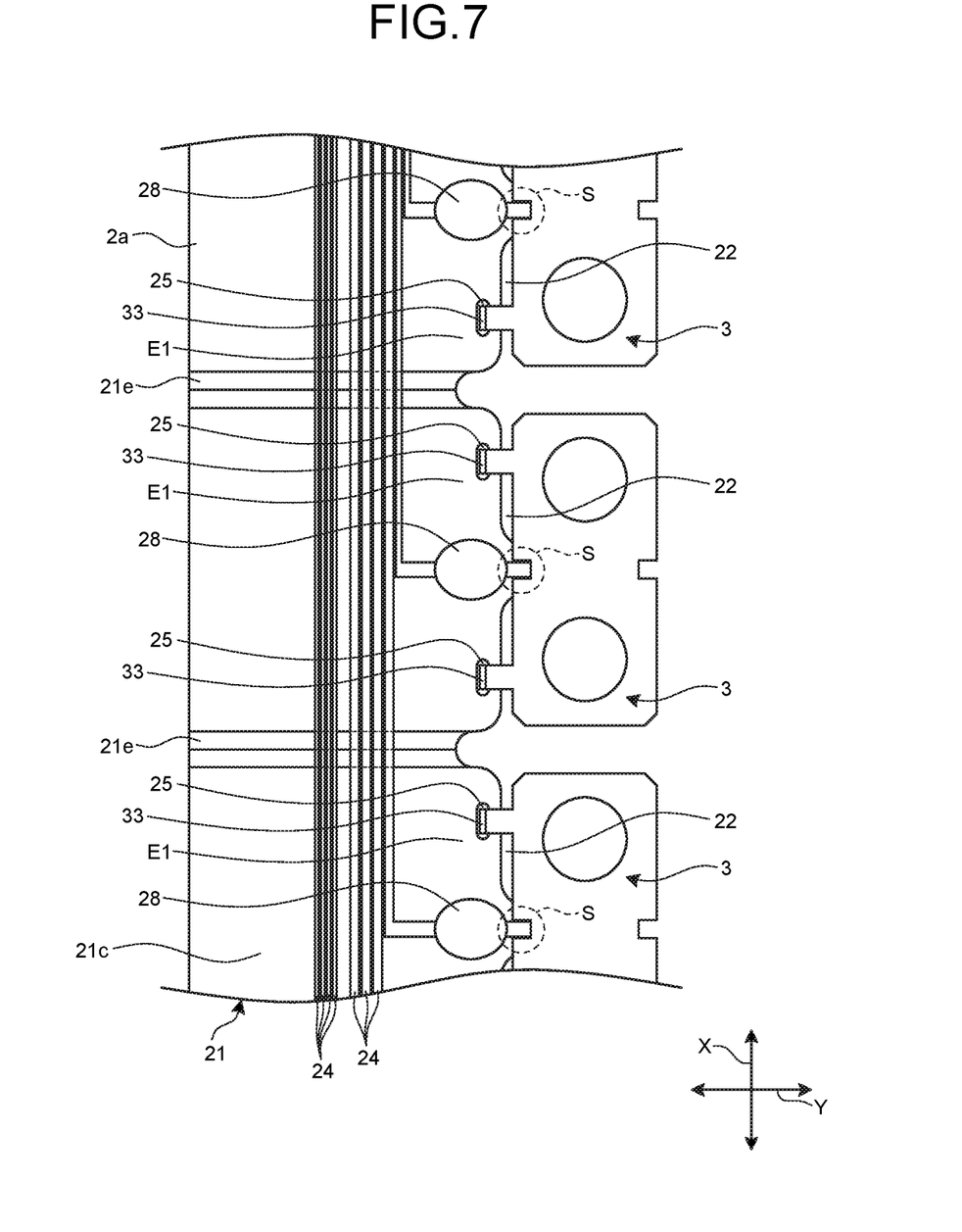
FIG. 7 is a plan view of the main part illustrating a modification of the conductor module according to the embodiment.

Incidentally, the four through-holes 25 are provided in the wiring member 2 for the single bus bar 3 in the above-described embodiment, but the embodiment is not limited thereto as long as at least the two through-holes 25 are formed in the first opposing region E1, which opposes one end face of the wiring members 2 between both the end faces of the bus bars 3 opposing each other in the opposing direction, with the electrical connection portion S interposed therebetween when viewed from the width direction. FIG. 6 is a plan view of the main part illustrating a modification of the conductor module according to the embodiment. FIG. 7 is a plan view of the main part illustrating a modification of the conductor module according to the embodiment. In the conductor module 1, two through-holes 25 may be formed in the first opposing region E1 and one through-hole 25 may be formed in the second opposing region E2, and three through-holes 25 may be provided on the wiring member 2 with respect to the single bus bar 3 as illustrated in FIG. 6. In this case, it is preferable that the one through-hole 25 in the second opposing region E2 be formed at the same position as the electrical connection portion S when viewed from the width direction. In addition, only the two through-holes 25 may be formed in the first opposing region E1 in the conductor module 1 as illustrated in FIG. 7.

Figure 8:
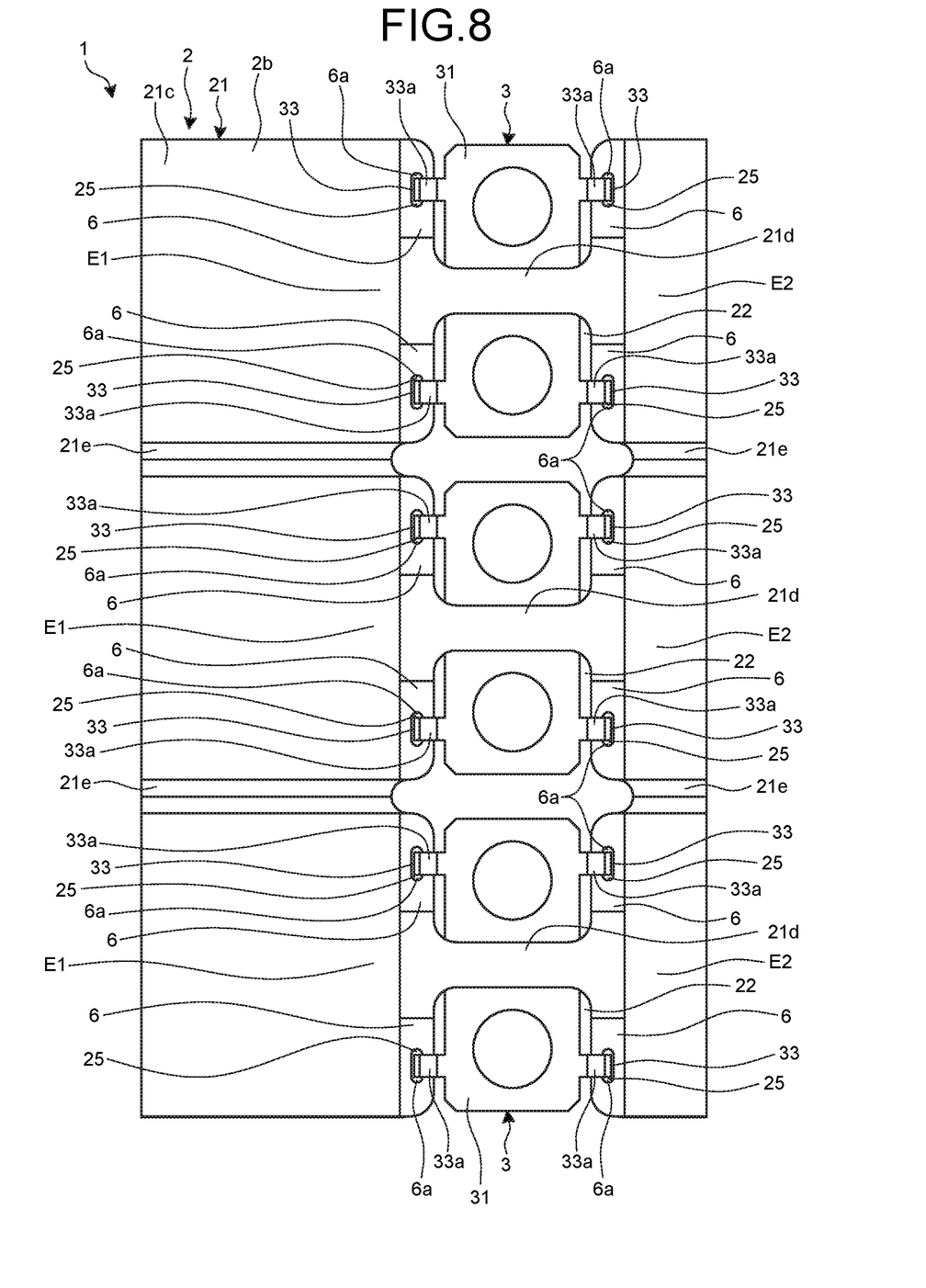
FIG. 8 is a bottom view of the main part illustrating a modification of the conductor module according to the embodiment.
Figure 9:
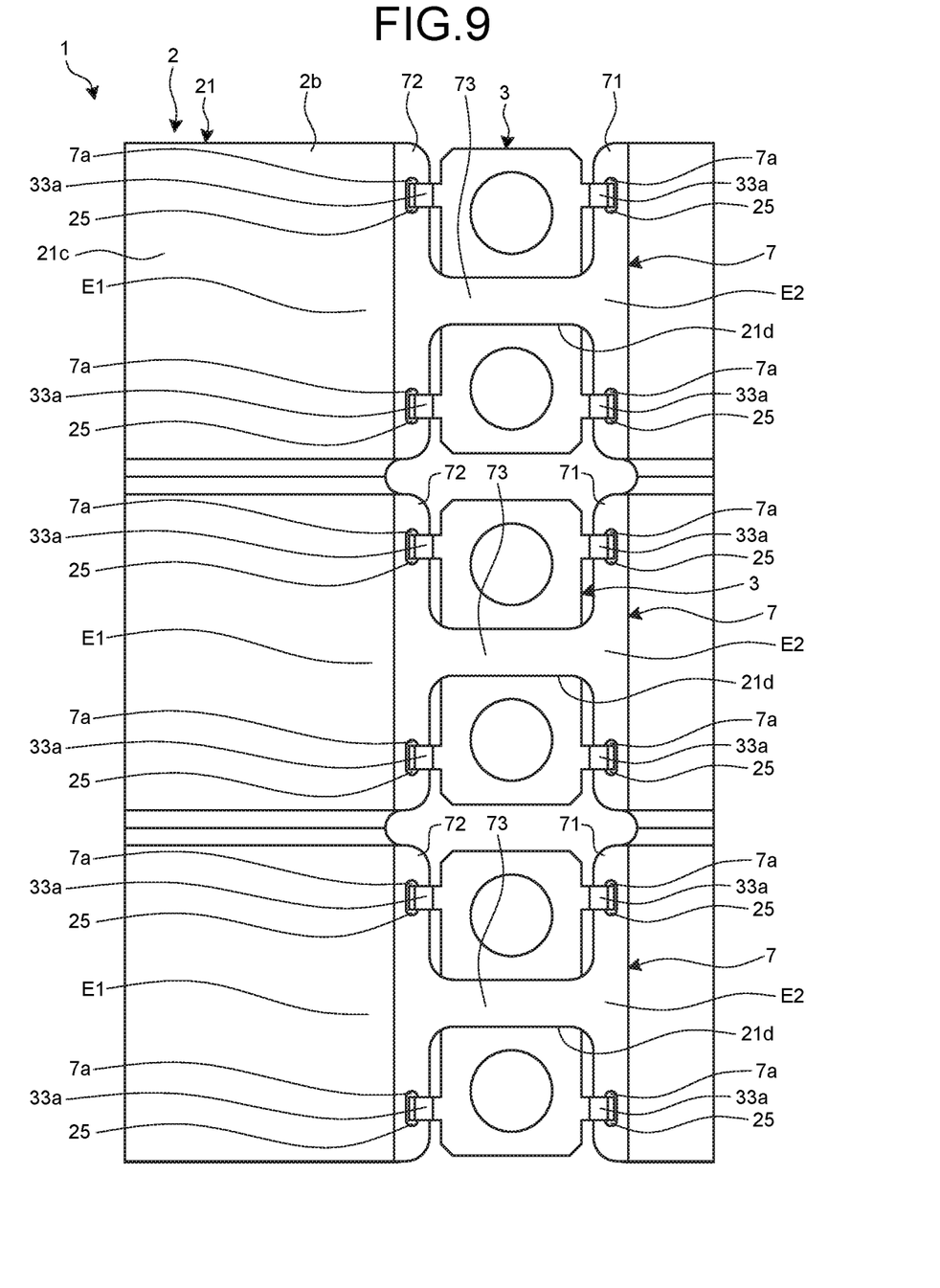
FIG. 9 is a bottom view of the main part illustrating a modification of the conductor module according to the embodiment.

In addition, the reinforcing member 4 is formed in each of the opposing regions E1 and E2, and is formed to surround all the through-holes formed in the opposing regions E1 and E2 in the above-described embodiment, but the embodiment is not limited thereto. FIG. 8 is a bottom view of the main part illustrating a modification of the conductor module according to the embodiment. FIG. 9 is a bottom view of the main part illustrating a modification of the conductor module according to the embodiment. As illustrated in FIG. 8, a reinforcing member 6 may be formed to surround each of the through-holes 25 in the conductor module 1. That is, one communicating hole 6a communicating with the through-hole 25 formed in the reinforcing member 6 is formed for the single reinforcing member 6. In addition, as illustrated in FIG. 9, one reinforcing member 7 may be formed in the conductor module 1 instead of independently providing the reinforcing members to correspond to the respective opposing regions E1 and E2. The reinforcing member 7 has two opposing region portions 71 and 72 and a connecting portion 73. The reinforcing member 7 has an H shape when the two opposing region portions 71 and 72 are connected by the one connecting portion 73 and viewed from the vertical direction. The opposing region portions 71 and 72 correspond to the first opposing region E1 and the second opposing region E2, and are formed in a rectangular shape with the longitudinal direction as the array direction thereof. The connecting portion 73 corresponds to the connecting portion 21d of the substrate main body 21. Communicating holes 7a corresponding to the respective through-holes 25 are formed in the two opposing region portions 71 and 72. As compared with the pair of reinforcing members 4 separated from each other in the width direction, the reinforcing member 7 can enhance strength due to the connection via the connecting portion 73. Therefore, it is possible to improve the durability of the mechanical connection portion. Incidentally, the reinforcing members 4, 6, and 7 are formed on the back surface 2b side of the wiring member 2, but the embodiment is not limited thereto, and the reinforcing members 4, 6, and 7 may be formed on the front surface 2a side, or may be formed on both the front surface 2a side and the back surface 2b side.

Incidentally, the terminal hole 32 is formed in the bus bar 3 in the above-described embodiment and modifications, but the embodiment and modifications are not limited thereto, and the terminal hole 32 is not necessarily formed. In this case, the connection between the bus bar 3 and the electrode terminal 102 is performed by soldering, resistance welding, ultrasonic bonding, laser welding, or the like.

In addition, the flexible printed circuit board in which the detection conductor is the wiring 24 is used as the wiring member 2 in the above-described embodiment and modifications, but the embodiment and modifications are not limited thereto. For example, a flexible flat cable (FFC), which is a film-like insulator having insulation properties and flexibility and in which a plurality of conductive wires serving as detection conductors are arrayed in the width directions to be embedded may be used.

Incidentally, the case where the connection conductor is electrically connected to the electrode terminal 102 in a direct manner as the bus bar 3 has been described in the above-described embodiment and modifications, but the embodiment and modifications are not limited thereto. For example, the connection conductor may be electrically connected to a bus bar which electrically connects the electrode terminals 102 adjacent to each other in the array direction in series in a direct manner. In other words, the connection conductor may be electrically connected to the electrode terminal 102 via the bus bar in an indirect manner.

In addition, the locking piece 33 formed integrally with the bus bar 3 is used as the fixing member in the above-described embodiment and modifications, but the embodiment and modifications are not limited thereto. The fixing member may be a separate member from the bus bar 3 as long as the fixing member fixes the bus bar 3 to the wiring member 2. For example, the fixing member may be rivets which are arranged in the communicating hole communicating with the through-hole 25 formed in the bus bar 3, the through-hole 25, and the communicating holes 4a to 7a. The fixing member has insulating properties, is made of a synthetic resin or the like having thermoplasticity, and has a top portion having a larger diameter than that of the communicating hole of the bus bar 3 and trunk portion inserted into a communicating hole formed in the bus bar 3, a through-hole 25, and the communicating holes 4a to 7a. The distal end of the trunk portion protruding from the communicating holes 4a to 7a, that is, protruding from the wiring member 2 maybe plastically deformed by applying an external force while heating such that the distal end is positioned radially outward of the through-hole 25 when viewed from the axial direction of the through-hole 25. In addition, when the fixing member is a separate member from the bus bar 3, the fixing member may be a brazing wax, a tie wrap, or an adhesive. In addition, when fixing the bus bar 3 to the wiring member 2, it is also possible to directly fix the bus bar 3 to the wiring member 2 by welding or the like without using the fixing member.

In a conductor module according to the present embodiment, a fixing member is fixed to a connection conductor in a state where relative movement with respect to the connection conductor is restricted, is arranged in a through-hole of a wiring member, and has a distal end positioned radially outward of the through-hole when viewed from an axial direction of the through-hole. Thus, the connection conductor is mechanically connected to the film-like wiring member by the fixing member, and the connection conductor is reliably fixed to the film-like wiring member, thereby obtaining effects that it is possible to achieve reduction in height and to suppress deterioration of connection reliability.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A conductor module comprising:
   at least two or more connection conductors that are electrically connected to one of two electrode terminals of a battery cell in a battery module having a plurality of the battery cells;
   a film-like wiring member having flexibility in which at least two or more detection conductors, which electrically connect the single connection conductor and a state detection device detecting a state of the battery cell electrically connected to the connection conductor, are formed; and
   a fixing member that fixes the connection conductor to the wiring member, wherein
   the wiring member has a connection conductor accommodating portion accommodating the connection conductor and a through-hole penetrating from a front surface to a back surface,
   at least two of the through-holes are formed in a first opposing region of the wiring member, which opposes one end face between two end faces of the connection conductor opposing each other in an opposing direction of the connection conductors with an electrical connection portion where the connection conductor and the detection conductor are electrically connected interposed between the at least two of the through-holes when viewed from the opposing direction, and
   the fixing member is fixed to the connection conductor in a state where relative movement with respect to the connection conductor is restricted, is arranged in the through-hole, and has a distal end positioned radially outward of the through-hole when viewed from an axial direction of the through-hole.

2. The conductor module according to claim 1, wherein the fixing member is formed integrally with the connection conductor and is a locking piece which is inserted into the through-hole to be arranged in the through-hole.

3. The conductor module according to claim 1, wherein the wiring member is formed with the connection conductor interposed therebetween in the opposing direction, and
   one or more of the through-holes is further formed in a second opposing region of the wiring member which opposes the other end face between two end faces of the connection conductor opposing each other in the opposing direction.

4. The conductor module according to claim 2, wherein the wiring member is formed with the connection conductor interposed therebetween in the opposing direction, and
   one or more of the through-holes is further formed in a second opposing region of the wiring member which opposes the other end face between two end faces of the connection conductor opposing each other in the opposing direction.

5. The conductor module according to claim 3, wherein two of the through-holes are formed in the first opposing region with the electrical connection portion interposed therebetween when viewed from the opposing direction, and two of the through-holes are formed in the second opposing region with the electrical connecting portion interposed therebetween when viewed from the opposing direction.

6. The conductor module according to claim 4, wherein two of the through-holes are formed in the first opposing region with the electrical connection portion interposed therebetween when viewed from the opposing direction, and two of the through-holes are formed in the second opposing region with the electrical connecting portion interposed therebetween when viewed from the opposing direction.

7. The conductor module according to claim 1, wherein a bent portion, which protrudes toward one of the front surface side and the back surface side, is formed in the wiring member between the adjacent connection conductors when viewed from the opposing direction.

8. The conductor module according to claim 2, wherein a bent portion, which protrudes toward one of the front surface side and the back surface side, is formed in the wiring member between the adjacent connection conductors when viewed from the opposing direction.

9. The conductor module according to claim 3, wherein a bent portion, which protrudes toward one of the front surface side and the back surface side, is formed in the wiring member between the adjacent connection conductors when viewed from the opposing direction.

10. The conductor module according to claim 4, wherein a bent portion, which protrudes toward one of the front surface side and the back surface side, is formed in the wiring member between the adjacent connection conductors when viewed from the opposing direction.

11. The conductor module according to claim 5, wherein a bent portion, which protrudes toward one of the front surface side and the back surface side, is formed in the wiring member between the adjacent connection conductors when viewed from the opposing direction.

12. The conductor module according to claim 6, wherein a bent portion, which protrudes toward one of the front surface side and the back surface side, is formed in the wiring member between the adjacent connection conductors when viewed from the opposing direction.

* * * * *